United States Patent
Dai et al.

(10) Patent No.: US 7,714,667 B2
(45) Date of Patent: May 11, 2010

(54) PROGRAMMABLE LINEAR TRIMMING METHOD AND SYSTEM FOR PHASE LOCKED LOOP CIRCUIT CALIBRATION

(75) Inventors: Xingdong Dai, Bethlehem, PA (US); Yasser Ahmed, Macungie, PA (US); Christopher J. Abel, Coplay, PA (US); Shawn Michael Logan, Andover, MA (US)

(73) Assignee: Agere Systems Inc., Allentown, PA (US)

( * ) Notice: Subject to any disclaimer, the term of this patent is extended or adjusted under 35 U.S.C. 154(b) by 70 days.

(21) Appl. No.: 11/934,426

(22) Filed: Nov. 2, 2007

(65) Prior Publication Data

US 2009/0115536 A1    May 7, 2009

(51) Int. Cl.
*H03L 7/113* (2006.01)
(52) U.S. Cl. .................. 331/16; 331/179; 331/1 A; 331/11; 327/156
(58) Field of Classification Search ............ 331/10, 331/11, 14, 16, 44, 179, 1 A; 327/156, 157
See application file for complete search history.

(56) References Cited

U.S. PATENT DOCUMENTS

| | | | |
|---|---|---|---|
| 6,337,589 B1 * | 1/2002 | Ooishi | 327/156 |
| 6,552,618 B2 * | 4/2003 | Nelson et al. | 331/11 |
| 7,489,754 B2 | 2/2009 | Dai et al. | 375/360 |
| 2005/0083137 A1 * | 4/2005 | Lee et al. | 331/16 |
| 2005/0237125 A1 * | 10/2005 | Hino | 331/179 |
| 2006/0192593 A1 | 8/2006 | Dai et al. | 327/43 |
| 2006/0220758 A1 * | 10/2006 | Rachedine et al. | 331/185 |
| 2006/0255862 A1 * | 11/2006 | Wu | 331/16 |
| 2007/0249293 A1 * | 10/2007 | Chae et al. | 455/76 |

* cited by examiner

*Primary Examiner*—Robert Pascal
*Assistant Examiner*—Ryan J Johnson
(74) *Attorney, Agent, or Firm*—Mendelsohn, Drucker & Associates, P.C.; Steve Mendelsohn

(57) ABSTRACT

The present invention implements an apparatus for calibrating a phase locked loop (PLL) circuit. The apparatus includes a detector for detecting frequencies of a reference signal and a controlled oscillator contained in the PLL circuit. The detector outputs the frequency difference to a control circuit. The control circuit is programmed to adjust one or more control signals to the controlled oscillator based upon the frequency difference in an orderly fashion to complete the calibration process.

18 Claims, 3 Drawing Sheets

PROGRAMMABLE LINEAR TRIMMING METHOD AND SYSTEM FOR PHASE LOCKED LOOP CIRCUIT CALIBRATION

FIELD OF THE INVENTION

The invention pertains to the calibration of high speed circuitry. More specifically, the invention pertains to calibrating a voltage controllable oscillator used in a phase locked loop circuit with a reference signal.

BACKGROUND OF THE INVENTION

As semiconductor line widths decrease, designers and programmers are configuring the devices to run at faster speeds. In addition to the demand for higher speed devices, demands also exist for device performance with higher levels of signal accuracy. One example of electronic devices where signal accuracy is of great importance is devices that communicate wirelessly.

One tool used by designers to improve the accuracy of a signal is a phase locked loop (PLL). A PLL is an electronic control system that generates a signal that is locked to the phase (and frequency) of an input or "reference" signal. PLLs are widely used in radio, telecommunications and computers to generate stable frequency signals, or to recover a signal from a noisy communication channel. A PLL includes specific circuit components to adjust the control voltage of a voltage controllable oscillator until its output phase is identical to that of the reference signal.

FIG. 1 illustrates a sample PLL 100. Here, the reference signal 102 is input to the reference divider 104. The reference divider 104 reduces the clock rate of the reference signal to a rate that the other components can process. After dividing the frequency of the reference signal (if needed), the reference divider 104, passes the signal to the phase detector 106.

The phase detector 106 is the control element of the PLL 100. The phase detector 106 compares the phases of its two input clocks (in this example, the reference signal supplied by the reference divider 104 and the output of the voltage controllable oscillator feedback divider 112) and provides a corrective signal that is filtered which controls the oscillator to force the phase between the two compared clock signals to zero. In this example, the phase detector 106 provides a control signal to the loop filter 108.

The optional loop filter 108 receives the control signal from the phase detector 106 and creates a low pass filtered version of the phase detector output (VLF). For a voltage controlled oscillator (VCO) with a positive transfer function slope, the loop filter output voltage increases if the oscillator should produce a higher frequency signal, and conversely, is lowered if the oscillator should produce a lower frequency signal to match the two clock phases. The voltage controlled oscillator output is provided to an optional feedback divider 112. In FIG. 100, the feedback divider splits the output of the controlled oscillator 110 into two signals; one output provides the feedback input to the phase detector 106 for further comparison; the second output signal is an output signal 114.

The PLL described in FIG. 1 is a typical approach to producing phase locked signals. When implemented in an integrated circuit, PLL circuit performance can vary greatly over different silicon processes, voltage and temperature. A slight temperature change can change the value of the circuit components (e.g., the loop filter) or functionality of other PLL elements. Under some combinations of silicon process, supply voltage and temperature, there are occasions when the loop filter cannot produce a voltage signal that will result in the controlled oscillator producing a signal with the same phase as the reference signal. To avoid this undesirable condition, a PLL trimming method that calibrates components of the PLL, in particular the controlled oscillator, is often employed.

SUMMARY OF THE INVENTION

The present invention is a programmable linear trimming apparatus and method for quick calibration of a phase locked loop (PLL) circuit. The apparatus and method search through an operating range of a controlled oscillator and centers the output frequency of the controlled oscillator to an optimal frequency.

A first embodiment of the present invention is an apparatus for calibrating a PLL circuit. The apparatus includes a detector to compare the frequency difference between the reference signal and the output of the voltage controlled oscillator contained in the PLL circuit. A control circuit is programmed to adjust control signals to the controlled oscillator based upon the comparison of the frequencies.

DETAILED DESCRIPTION OF THE INVENTION

Figure 1:
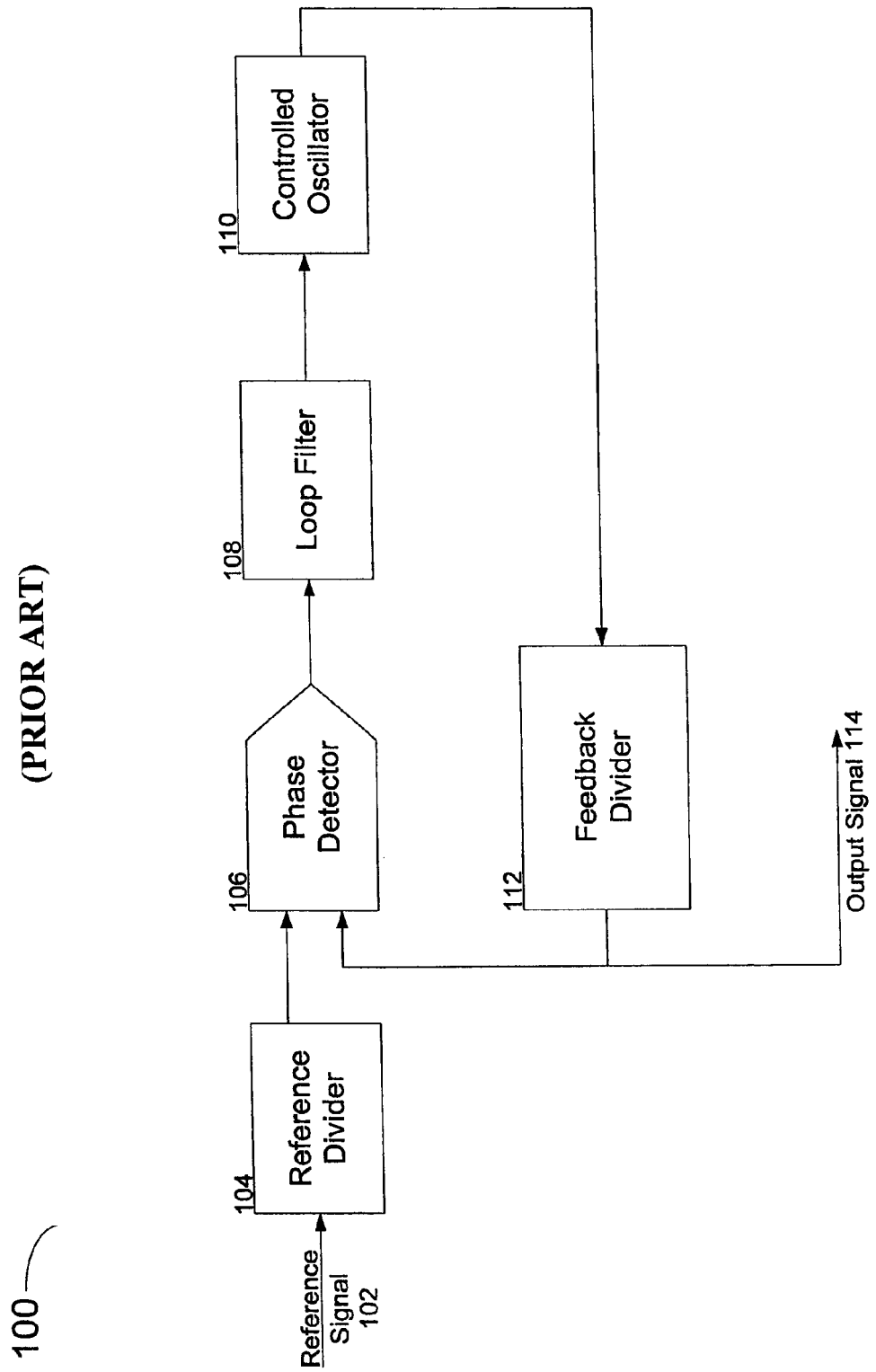
FIG. 1 is a conventional Phase Locked Loop (PLL) circuit for aligning the phase of an output signal to the phase of a reference input signal.
Figure 2:
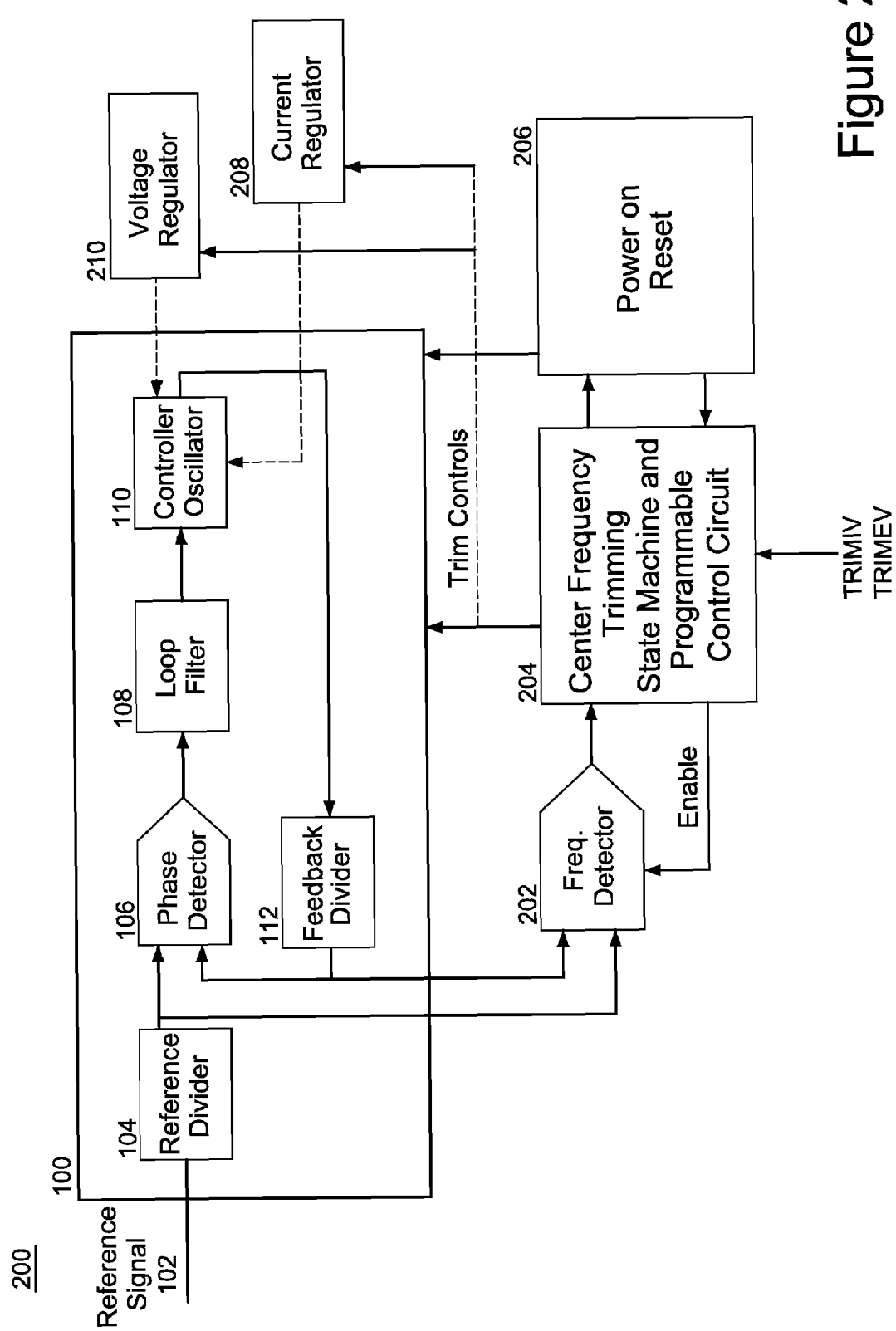
FIG. 2 is a modified PLL according to principles of the present invention.

FIG. 2 shows a trimming circuit 200 according to one preferred embodiment of the present invention. The trimming circuit 200 includes the PLL 100 from FIG. 1, along with several additional components. A first set of additional components are digital control circuits. In trimming circuit 200, the digital control circuits include frequency detector 202, the center frequency trimming state machine 204 and the power on reset (POR) startup state machine 206. A second set of additional components are analog control circuits and include the current regulator 208 and the voltage regulator 210.

The trimming circuit 200 begins operation when the POR state machine 206 signals the PLL to be brought up from a powered-down state. The POR state machine 206 will wait a pre-determined period of time during which any values stored in any registers or gates of the circuit reset to zero. Additionally, this time period allows any voltage or current regulators to initialize. During this initialization, the POR state machine sends a signal to PLL 100 to begin its standard closed loop functionality. After signaling PLL 100, the POR 206 sends a signal to the center frequency trimming state machine 204 indicating the PLL is being powered-up. Once the center frequency trimming state machine 204 receives this indication, it sends an enable signal to the frequency detector 202 to begin functioning.

Once the feedback divider provides an output, however, the phase locked loop feedback connection is opened by disconnecting the output of the loop filter 108 from the control voltage input of controlled oscillator 110 and replacing the loop filter output with a reference voltage or current. The reference voltage or current is chosen to set the VCO close to the center of its frequency range. In this open loop configuration, the frequency detector 202 directly compares the divided VCO frequency with the divided reference clock frequency.

The output of the frequency detector 202 is determined by the frequency difference of the two input signals. The design described herein uses a higher output from the frequency detector 202 to indicate the voltage controllable oscillator 110 is producing a signal with too high a frequency, however, the design can easily be modified to accommodate opposite control directions.

The trimming state machine 204 provides signals that serve as inputs to components of the phase locked loop. These inputs are typically encoded as digital signals and allow adjustment of the frequency of the voltage controllable oscillator when its control voltage input is set to the reference voltage or current. The trimming state machine 204 contains two registers, one for storing the initial value of the trimming state machine output (TRIMIV) and one for storing the end value of the trimming control (TRIMEV). An additional value, TRIMCV represents the current value of the trimming state machine output. Upon initialization of the frequency trimming state machine 204, TRIMCV is set equal to TRIMIV.

The center frequency trimming state machine 204 acts as controller for the PLL 100 as well as the current regulator 208 and voltage regulator 210 once the PLL 100 has entered its open-loop state. First, the center frequency trimming state machine 204 sends a signal to the loop filter 108 to replace its output with a constant reference voltage or current to the control voltage input of the controlled oscillator 110. This will stop the PLL 100 from making any changes to the operation of the controlled oscillator 110. Changes to the controlled oscillator 110 will now be determined by center frequency trimming state machine 204 and signaled to the controlled oscillator 110 by signals from either current regulator 208 or voltage regulator 210. By controlling the controlled oscillator 110 with center frequency trimming state machine 204, the control is moved to a digital component, and time is saved as the operation of phase detector 106 and loop filter 108 is eliminated.

Once center frequency trimming state machine 204 has received both TRIMIV and TRIMEV signals, the control of controlled oscillator 110 fully begins. Again, as before, TRIMCV is set equal to TRIMIV. If the TRIMCV value is smaller than that of TRIMEV, the center frequency trimming state machine 204 starts calibrating the controlled oscillator at its lowest programmed output frequency by sending a signal to either current regulator 208 or voltage regulator 210 to set the operating frequency of the controlled oscillator 110. After a controlled settling time (during which the output of controlled oscillator 110 filters through the various components), the center frequency trimming state machine 204 makes another comparison. If the signal from the controlled oscillator is slower than that of the reference, the center frequency trimming state machine 204 increments the control signal sent to the current regulator 208 or the voltage regulator 210 by one and repeats the settling time and makes another comparison. This process is repeated until the frequency of the voltage controlled oscillator 110 output is equal or greater than the reference signal frequency. If the output frequency of the voltage controlled oscillator 110 is higher than the frequency of the reference signal, a step-back function is initiated. If the output frequency of the voltage controlled oscillator is unacceptably higher than that of the reference signal, the control signals are decremented by one and the trimming algorithm is complete.

Conversely, if TRIMIV value is larger than that of TRIMEV, the center frequency trimming state machine 204 starts calibrating the controlled oscillator at its highest programmed output frequency by sending a signal to either current regulator 208 or voltage regulator 210 to set the operating frequency of the controlled oscillator 110 to its maximum frequency. After a controlled settling time (during which the output of controlled oscillator 110 filters through the various components), the center frequency trimming state machine 204 makes another comparison. If the frequency of the controlled oscillator is higher than that of the reference frequency, the center frequency trimming state machine 204 decrements the control signal sent to the current regulator 208 or the voltage regulator 210 by one and repeats the settling time and makes another frequency comparison. This process is repeated until the frequency of the voltage controlled oscillator 110 output is equal to or less than the frequency of the reference signal. If the frequency of the voltage controlled oscillator 110 is a lower frequency than that of the controlled oscillator 110, a step-back function is initiated. If the frequency of the voltage controlled oscillator is unacceptably less than that of the reference signal, the control signals are incremented by one and the trimming algorithm is complete.

At this time, the reference voltage or current signal at the control voltage input to the voltage controllable oscillator is removed and its input is provided by the loop filter. This closes the feedback loop of the phase locked loop in preparation for closed loop operation.

Figure 3:
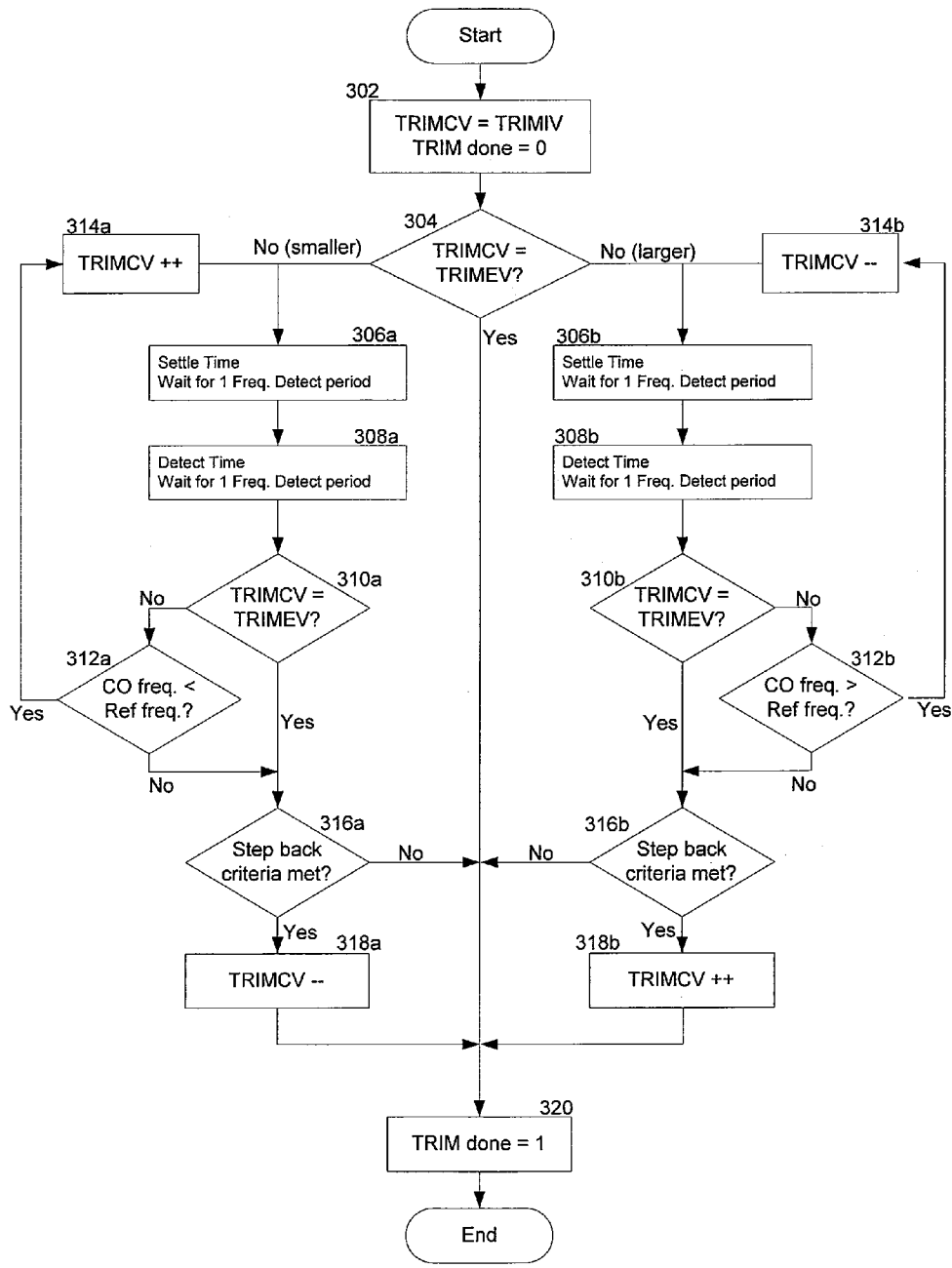
FIG. 3 is a flow diagram illustrating one exemplary embodiment of the present invention.

FIG. 3 illustrates a flowchart detailing the algorithm. The process begins at step 302 after the power-on reset operation has been completed and the PLL 100 is functioning in open-loop operation. At step 302, TRIMCV is set equal to the value of the TRIMIV, and Trim done is set equal to zero. Trim done is a value representing the end of the trim function. Once the TRIMCV value and Trim done signal have been set, the process proceeds to step 304. Here, an initial comparison of TRIMCV and TRIMEV is done. Three possible outcomes can occur during this comparison: (1) TRIMCV is smaller than TRIMEV; (2) TRIMCV is larger than TRIMEV; and (3) TRIMCV and TRIMEV are equal. For case (1), the process proceeds to the left side of the flow chart, to step 306a. Here, a delay of one frequency detection period to allow any changes to the controlled oscillator to occur and the inputs to frequency detector 202 to update. Then the process proceeds to step 308a. Here, one frequency detection period elapses during which the frequency detector records the frequency difference between the reference signal and the voltage controlled oscillator 110. The process proceeds to step 310a. At step 310a, the TRIMCV value is compared to TRIMEV. If the TRIMCV value does not equal TRIMEV, the process proceeds to step 312a. Here the center frequency trimming state machine 204 determines if the frequency of the voltage controlled oscillator is less than the frequency of the reference signal. If it is, the process proceeds to step 314a where the TRIMCV value is incremented and steps 306a-310a are repeated.

If at step 310a the TRIMCV value does equal TRIMEV, or at step 312a the center frequency trimming state machine 204 determines that the frequency of the voltage controlled oscillator is higher than the frequency of the reference signal, the process moves to step 316a. Here, the step back criteria is examined. Essentially, the center frequency trimming state machine 204 determines if the frequency difference between the voltage controlled oscillator and the frequency of the reference signal is outside an acceptable range. If it is, the process proceeds to step 318a where the control signal is decremented. The process then proceeds to step 320 where Trim done is set to one and the process ends.

For case (2), the process is basically the inverse of case (1). The process proceeds to the right side of the flow chart, to step 306b. Here, there is a wait time of one frequency detection period to allow for settling of the frequency of the controlled oscillator and frequency detector 202. Then the process proceeds to step 308b where one frequency detection period elapses during which the frequency detector records the frequency difference between the reference signal and the voltage controlled oscillator 110. Once the frequency detector 202 has recorded the difference frequency, the process proceeds to step 310b where the TRIMCV value is compared to TRIMEV. If the TRIMCV value does not equal TRIMEV, the process proceeds to step 312b. At step 312b, the center frequency trimming state machine 204 determines if the frequency of the voltage controlled oscillator is greater than the frequency of the reference signal. If it is, the process proceeds to step 314b where the TRIMCV value is decremented and steps 306b-310b are repeated.

If at step 310b the TRIMCV value does equal TRIMEV, or at step 312b the center frequency trimming state machine 204 determines that the frequency of the voltage controlled oscillator is less or equal to the frequency of the reference signal, the process moves to step 316b where the step back criteria is examined. Essentially, the center frequency trimming state machine 204 determines if the frequency difference between the voltage controlled oscillator and the reference clock is outside an acceptable range. If it is, the process proceeds to step 318b where the control signal is incremented by one. The process then proceeds to step 320 where Trim done is set to one and the process ends.

For case (3), where TRIMCV and TRIMEV are initially equal, the process proceeds directly to step 320 where Trim done is set to one and the process ends.

The circuit described in FIG. 2 is merely shown by way of example and is in no way meant to limit the scope of the present invention. It would be obvious to one of ordinary skill in the art to make various modifications to the process and still achieve the same result, for example, the digital components (i.e., frequency detector 202, center frequency trimming state machine 204 and power on reset state machine 206) could be included in a software application. Another possible modification would be to include additional registers for storing additional trimming level values.

Similarly, the process described in FIG. 3 is merely shown by way of example and is in no way meant to limit the scope of the present invention. It would be obvious to one of ordinary skill in the art to make various modifications to the process and still achieve the same result, for example, by using different step back criteria.

Additional alterations, modifications, and improvements as are made obvious by this disclosure are intended to be part of this description though not expressly stated herein, and are intended to be within the spirit and scope of the invention. Accordingly, the foregoing description is by way of example only, and not limiting. The invention is limited only as defined in the following claims and equivalents thereto.

The invention claimed is:

1. An apparatus for calibrating a phase locked loop (PLL) circuit, comprising:
  a detector for detecting a frequency difference between a first frequency associated with a reference signal and a second frequency associated with a controlled oscillator contained in said PLL circuit and outputting said frequency difference;
  a programmable control circuit operably connected to said detector, the programmable control circuit programmed to:
    receive a set of values corresponding to an operating range of frequencies for the controlled oscillator;
    receive said frequency difference;
    assign a value to a variable within said set of operating values based on said frequency difference; and
    supply control signals to said controlled oscillator based upon said variable; and
  a state machine including said programmable control circuit, and the set of values includes a first value corresponding to an initial value of output from said state machine and a second value corresponding to an end value of output from said state machine.

2. The apparatus of claim 1, further comprising a voltage controller for supplying said controlled oscillator with a reference voltage.

3. The apparatus of claim 2, wherein said control circuit uses said voltage controller to control said second frequency associated with said controlled oscillator.

4. The apparatus of claim 3, wherein said reference voltage is variably adjusted by said control circuit to adjust said second frequency associated with said controlled oscillator.

5. The apparatus of claim 4, wherein said control circuit variably adjusts said reference voltage until said frequency difference is within a predetermined acceptable range.

6. The apparatus of claim 1, further comprising a current controller for supplying said controlled oscillator with a reference current.

7. The apparatus of claim 6, wherein said control circuit uses said currently controller to control said second frequency associated with said controlled oscillator.

8. The apparatus of claim 7, wherein said reference currently is variably adjusted by said control circuit to adjust said second frequency associated with said controlled oscillator.

9. The apparatus of claim 8, wherein said control circuit variably adjusts said reference currently until said frequency difference is within a predetermined acceptable range.

10. A method for calibrating a phase locked loop (PLL) circuit including a controlled oscillator and that receives a reference signal, the method comprising the steps of:
  receiving a set of values corresponding to an operating range of frequencies for the controlled oscillator;
  receiving said reference signal and a signal from said controlled oscillator and determining a frequency difference between said signals;
  assigning a value to a variable within said set of operating values based on said frequency difference;
  outputting an updated set of one or more control signals to said controlled oscillator based upon said variable; and
  ceasing to output an updated set of one or more control signals to said controlled oscillator when said frequency difference is within a predetermined acceptable range, wherein said set of values includes a first value corresponding to an initial value of output from a state machine and a second value corresponding to an end value output from said state machine.

11. The method of claim 10, further comprising the step of:
  providing a control voltage to an input of said controlled oscillator for supplying said controlled oscillator with a reference voltage.

12. The method of claim 11, wherein said control circuit uses said voltage controller to control said second frequency associated with said controlled oscillator.

13. The method of claim 12, wherein said reference voltage is variably adjusted by said control circuit to adjust said second frequency associated with said controlled oscillator.

14. The method of claim 13, wherein said control circuit variably adjusts said reference voltage until said frequency difference is within said predetermined acceptable range.

15. The method of claim 10, further comprising the step of:

providing a control currently to an input of said controlled oscillator for supplying said controlled oscillator with a reference current.

16. The method of claim 15, wherein said control circuit uses said current controller to control said second frequency associated with said controlled oscillator.

17. The method of claim 16, wherein said reference current is variably adjusted by said control circuit to adjust said second frequency associated with said controlled oscillator.

18. The method of claim 17, wherein said control circuit variably adjusts said reference currently until said frequency difference is within said predetermined acceptable range.

* * * * *